(12) United States Patent
Korbler et al.

(10) Patent No.: US 6,955,727 B2
(45) Date of Patent: Oct. 18, 2005

(54) SUBSTRATE PROCESS TANK WITH ACOUSTICAL SOURCE TRANSMISSION AND METHOD OF PROCESSING SUBSTRATES

(75) Inventors: John Korbler, Mertztown, PA (US); Xuecang Geng, State College, PA (US)

(73) Assignee: Akrion, LLC, Allentown, PA (US)

( * ) Notice: Subject to any disclaimer, the term of this patent is extended or adjusted under 35 U.S.C. 154(b) by 102 days.

(21) Appl. No.: 10/699,042

(22) Filed: Oct. 31, 2003

(65) Prior Publication Data

US 2004/0149308 A1 Aug. 5, 2004

(Under 37 CFR 1.47)

Related U.S. Application Data

(60) Provisional application No. 60/423,263, filed on Nov. 1, 2002.

(51) Int. Cl.⁷ .............................. B08B 7/00; B08B 7/02
(52) U.S. Cl. ............................ 134/1; 134/1.3; 134/184; 134/902
(58) Field of Search ............................ 134/1, 1.3, 184, 134/902

(56) References Cited

U.S. PATENT DOCUMENTS

| | | | |
|---|---|---|---|
| 4,736,760 A | 4/1988 | Coberly | |
| 4,804,007 A | 2/1989 | Bran | |
| 4,859,278 A | 9/1989 | Bran | |
| 4,977,688 A | * 12/1990 | Roberson et al. | ............... 34/92 |
| 4,998,549 A | 3/1991 | Bran | |
| 5,037,481 A | 8/1991 | Bran | |
| 5,355,048 A | 10/1994 | Estes | |
| 6,188,162 B1 | 2/2001 | Vennerbeck | |
| 6,189,552 B1 | * 2/2001 | Oshinowo | ................... 134/201 |
| 6,222,305 B1 | * 4/2001 | Beck et al. | ................. 310/334 |
| 2002/0050768 A1 | 5/2002 | Beck | |

* cited by examiner

Primary Examiner—Alexander Markoff
(74) Attorney, Agent, or Firm—Cozen O'Connor, P.C.; Michael B. Fein, Esq.; Brian L. Belles, Esq.

(57) ABSTRACT

A system and method for improving the efficiency and effectiveness of the transmission of acoustical energy to process fluids during substrate processing, such as cleaning or photoresist stripping. The invention utilizes a layered stack of materials to transmit acoustical energy from a source of acoustical energy to the process fluid. The material of which each layer is constructed is chosen so as to reduce the differences in acoustical impedance between consecutive layers of the stack, providing a more gradual transition, in terms of acoustical impedance, when acoustical energy is being transmitted from the source to the process fluid. In one aspect, the invention is a system comprising: a process chamber for receiving a process fluid; an acoustical energy source; and an acoustical stack having a first transmission layer and a second transmission layer that forms an acoustical energy pathway from the acoustical energy source to the process fluid in the process chamber.

27 Claims, 5 Drawing Sheets

FIGURE 1 : PRIOR ART

SUBSTRATE PROCESS TANK WITH ACOUSTICAL SOURCE TRANSMISSION AND METHOD OF PROCESSING SUBSTRATES

CROSS REFERENCE TO RELATED APPLICATION

Benefit of Provisional Application Ser. No. 60/423,263 filed Nov. 1, 2002, is claimed.

TECHNICAL FIELD OF INVENTION

This invention generally relates to the field of substrate manufacturing, and specifically to methods and systems for improving the transmission of acoustical energy from an acoustical energy source to a process fluid during the processing of integrated circuits.

BACKGROUND OF INVENTION

In the manufacture of semiconductors, semiconductor devices are produced on thin disk-like substrates. Generally, each substrate contains a plurality of semiconductor devices. The exact number of semiconductor devices that can be produced on any single substrate depends both on the size of the substrate and the size of the semiconductor devices being produced thereon. However, semiconductor devices are becoming more and more miniaturized. As a result of this miniaturization, an increased number of semiconductor devices can be produced for any given area, thus, making the surface area of each substrate more and more valuable.

In producing semiconductor devices, substrates are subjected to a multitude of processing steps before a viable end product can be produced. These processing steps include: chemical-etching, wafer grinding, photoresist stripping, and masking. These steps typically occur in a process tank and often require that each substrate undergo many cycles of cleaning, rinsing, and drying during processing so that particles that may contaminate and cause devices to fail are removed from the substrates.

The importance of clean substrate surfaces in the fabrication of semiconductor devices has been recognized for a considerable period of time. The development of VLSI and ULSI silicon circuit technology has made the cleaning processes a particularly critical step in the fabrication process. Additionally, as the demand for semiconductor devices and the cost of labor increases, decreased production time has become a major concern in the semiconductor manufacturing industry. However, decreased production time must be achieved without compromising the quality of the resulting product or the yield of properly functioning devices per substrate.

In order to achieve these two goals, the use of acoustical energy (i.e., megasonic energy) during a number of processing steps has become common in the industry. The terms "megasonic energy" and "acoustical energy" are used interchangeably herein. Two processing steps in which the application of megasonic energy is particularly useful are cleaning and stripping. The application of megasonic energy during cleaning helps to more effectively remove particles from substrates while the use of megasonic energy during stripping can increase stripping rates.

In existing processes utilizing megasonic energy to clean substrates, a process tank is first filled with a cleaning solution such as standard clean 1 (SC-1), standard clean 2 (SC-2), deionized water, or a diluted variant of the aforementioned chemicals. SC-1 comprises 1 $NH_4OH$: 1 $H_2O_2$: 5 $H_2O$. SC-2 comprises 6 $H_2O$: 1 $H_2O_2$: 1 HCl. Once the process tank is filled with the selected fluid and the substrates are submerged therein, a source of megasonic energy is coupled to the fluid for producing and directing sonic energy through the fluid and across the surfaces of the substrates. During megasonic cleaning, the transducer will oscillate at a megasonic rate between a negative and a positive position, generating negative and positive pressures within the fluid. As the megasonic energy oscillates, cavitation bubbles form in the fluid during negative pressure and collapse during positive pressure. Cleaning of the substrates come from two major occurrences: (1) cavitations (microscopic implosions); and (2) streaming (wave fronts that move the fluid along).

Similarly, megasonic energy can also be used to increase stripping rates during substrate manufacturing. During a megasonic stripping process, substrates are placed in a process tank in the presence of a fluid, such as liquid ozonated deionized ("DI") water or a mist of ozonated DI water in an ozone gas atmosphere. Megasonic energy is then applied to the fluid as discussed above.

The standard means by which megasonic energy is produced is with piezoelectric crystals transducers. Piezoelectric crystals are pieces of ceramic which are metalized on both sides.

In order to transmit the megasonic energy to the fluid in which a substrate is being processed, existing systems use various types of rigid plates to connect the transducer to the tank. However, this set up has deficiencies with respect to the efficiency and effectiveness of the transmission of the megasonic energy from the transducers to the fluid. The transducers are directly bonded to one side of the rigid plate. Often, this bonding to the rigid plate is accomplished with less than ideal performance. The rigid plate is then coupled to a processing tank so that the side of the rigid plate that does not have the transducer affixed thereto is exposed to the processing fluid. One such prior art system is taught in U.S. Pat. No. 4,804,007, which is illustrated in FIG. 1. Referring to FIG. 1, piezoelectric crystals 5 are directly bonded to rigid plate 6. The piezoelectric crystals 5 are bound to the rigid plate by an epoxy bond. The rigid plate 6 is connected to a process tank so that the side of the rigid plate 6 that does not have the crystals 5 bonded thereto contacts the process fluid 7 in which the substrate is positioned. In utilizing this system, a high frequency energy source is applied across the piezoelectric crystals 5, causing the crystals 5 to create megasonic energy. This megasonic energy is transmitted from the crystals 5, though the rigid plate 6, and into the process fluid 7 within the process tank. It has been discovered that the megasonic energy that passes from the crystals 5 to the process fluid is significantly impeded due to the large differences in the acoustical impedance value ("Za") of the consecutive materials (i.e., the crystals 5 and the rigid plate 6; and the rigid plate 6 and the process fluid). While epoxy is present to bond the crystals 5 to the rigid plate 6, the epoxy layer is so thin that its effect on acoustical impedance is negligible.

The Za of a material is defined as the product of the density of that material times the velocity of sound in that material. The units for Za are Mrayl or ($kg/m^2s \times 10^6$). It has been discovered that the inefficient megasonic energy transmission of prior art systems is due in part to the differences in the Za of the materials through which the megasoinc energy must pass. More specifically, large differences in the Za between consecutive materials through which the megasonic energy must pass results in increased impedance of the megasonic energy and ineffective energy transfer to the process fluid.

The typical acoustical impedance of piezoelectric crystals that are typically used in a process tank utilizing megasonic energy transfer is Za=34 Mrayl while that of water is Za=1.5 Mrayl. Thus, in these systems, in order for megasonic energy to pass from the piezoelectric crystal into the water during substrate processing, the megasonic energy must undergo an acoustical impedance transition of approximately 32.5 Mrayl. While the rigid plates of prior art systems typically have a Za value that is between the Za of the crystals and the Za of the process fluid (e.g., quartz has a Za=12–15 Mrayl), the difference in the Za between the rigid plate and the fluid and/or the difference in the Za between the rigid plate and the crystals is still significant. This results in an undesired energy loss when the megasonic energy passes between the different materials. Additionally, prior art devices use the rigid plate only to connect the transducers (i.e., the crystals) to the tank and to protect the transducers from the fluid. The rigid plates are not intended or designed to smooth the difference in transition of acoustical impedance between the piezoelectric crystals and the process fluid.

Thus, in using systems, such as the one illustrated in FIG. 1, to process wafers, much of the megasonic energy that is created by the transducers 5 is not transmitted to the processing fluid 7 but is impeded from ever entering the fluid 7. Depending on the application, this energy loss can result in less than optimal cleaning and/or less than optimal stripping rates. Thus, existing systems that use megasonic energy to process substrates are less than optimal, resulting in energy transmission loss, increased energy usage, and/or less than optimal stripping and or cleaning performance.

DISCLOSURE OF THE INVENTION

It is therefore an object of the present invention to provide an improved method and system for transmitting megasonic energy to process fluid in a process tank for processing substrates.

Another object is to provide a method and system for transmitting acoustical energy to a process fluid in a process tank that reduces the amount of acoustical energy that is impeded from entering the process fluid.

A further object is to provide an improved method and system for cleaning substrates.

Yet another object is to provide an improved method and system for stripping substrates.

The present invention focuses on how to get megasonic energy that is generated by transducers into a process fluid in which a substrate is submerged in a more effective and efficient manner. While the invention is described and illustrated in detail, various alternatives and modifications will become readily apparent to those skilled in the art without departing from the spirit and scope of the invention. Specifically, while the invention is described in terms of transmitting megasonic energy during the cleaning and stripping processes, the present invention is not so limited and can be used in any process in which megasonic energy is transmitted to a fluid. Moreover, the identity of the fluid into which the megasonic energy is transmitted is not limiting. Finally, the present invention can be used in single-substrate process tanks or process tanks designed to process a plurality of substrates at one time.

The above objects and others are met by the present invention. The invention is the addition of one or more transmission layer(s) between the piezoelectric crystal and the rigid plate and/or the rigid plate and the fluid, so as to form an "Acoustical Stack." The addition of an extra transmission layer helps improve efficiency of the energy transfer from the transducer crystal to the final media by reducing the Za differences between consecutive layers of materials. The transmission layer(s) can be anywhere in the "Acoustical Stack". The invention preferably uses intermediate layers so as to provide gradual transitions of Za between the changing materials from the piezoelectric crystal until the processing fluid.

The exact Za value of the transmission layers will depend on the identity of the process fluid being used, the presence or absence of a rigid plate, and the position of the transmission layer in the acoustical stack. The transmission layer can be made of any material so long as it introduces an intermediate change in the acoustical impedance between the materials on either of its sides.

In one aspect, the invention is a system for processing at least one substrate comprising: a process chamber for receiving a process fluid; an acoustical energy source; an acoustical stack for transmitting acoustical energy from the acoustical energy source to process fluid in the process chamber, the acoustical stack having a first transmission layer and a second transmission layer; the first transmission layer located between the acoustical energy source and the second transmission layer, and having a first acoustical impedance value; and the second transmission layer located between the first transmission layer and process fluid in the process chamber, and having a second acoustical impedance value that is less than the first acoustical impedance value.

In another aspect, the invention is a method of processing a substrate comprising: providing a system comprising a process chamber at least partially filled with a process fluid, an acoustical energy source, an acoustical stack having a first transmission layer and a second transmission layer and forming an acoustical energy pathway from the acoustical energy source to process fluid in the process chamber, the first transmission layer located between the acoustical energy source and the second transmission layer and having a first acoustical impedance value, and the second transmission layer located between the first transmission layer and process fluid in the process chamber, and having a second acoustical impedance value that is less than the first acoustical impedance value; submerging the substrate in the process fluid; creating acoustical energy with the acoustical energy source; and transmitting the acoustical energy to the process fluid via the acoustical stack.

MODES FOR CARRYING OUT THE INVENTION

The following detailed embodiments are exemplary only and are not meant to be limiting.

Figure 1:
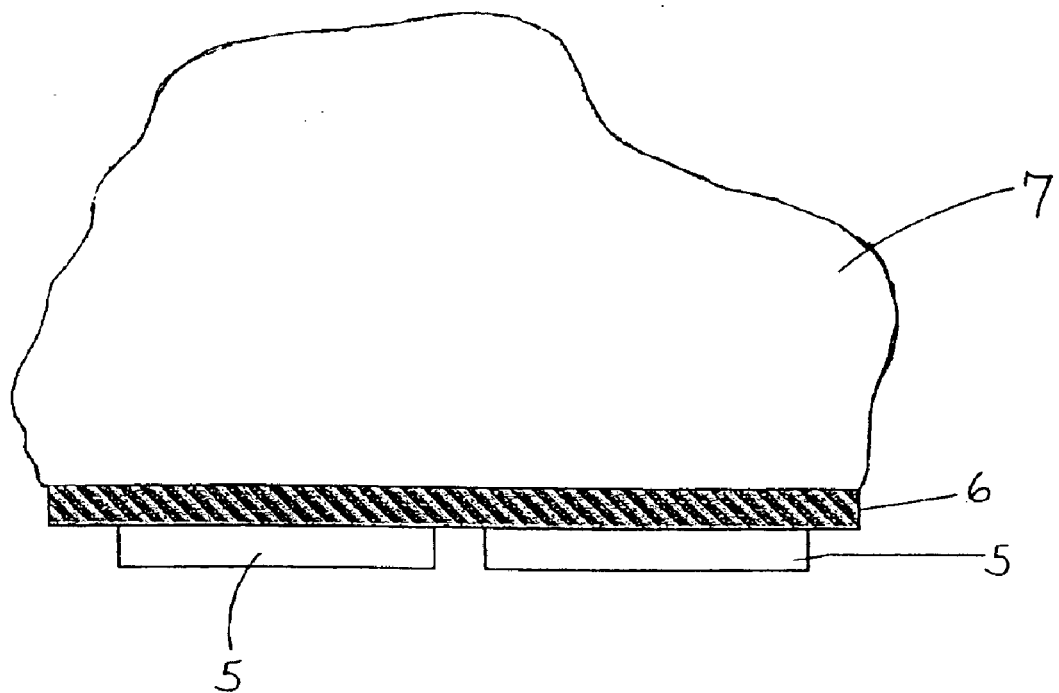
FIG. 1 is a schematic of a prior art megasonic system.
Figure 2:
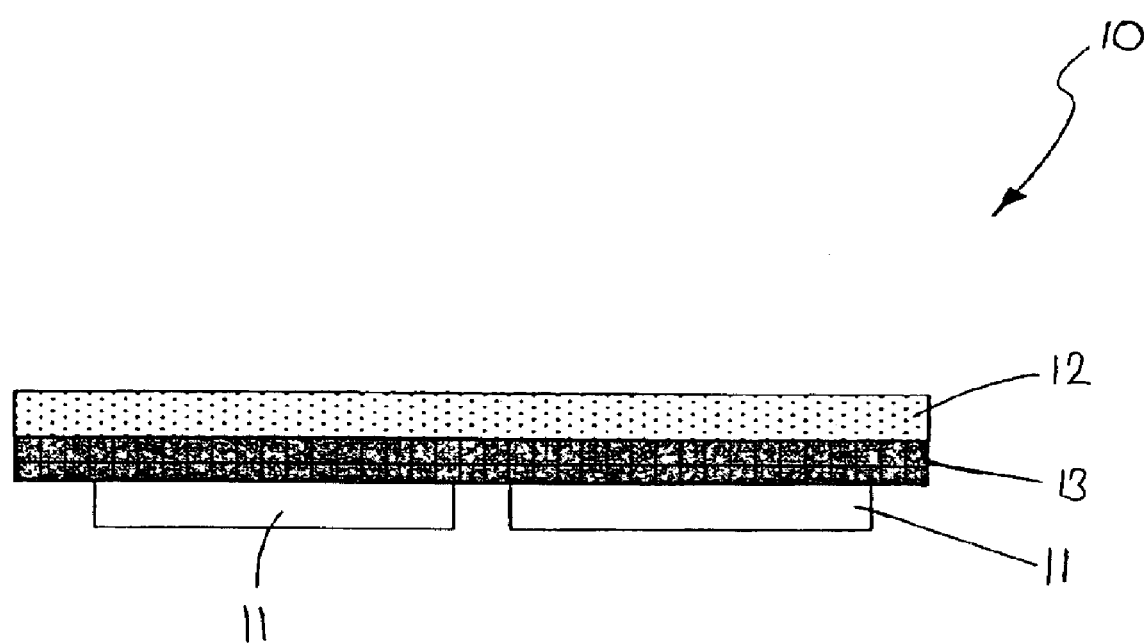
FIG. 2 is a schematic of ah acoustical stack according to a first embodiment of the present invention.
Figure 3:
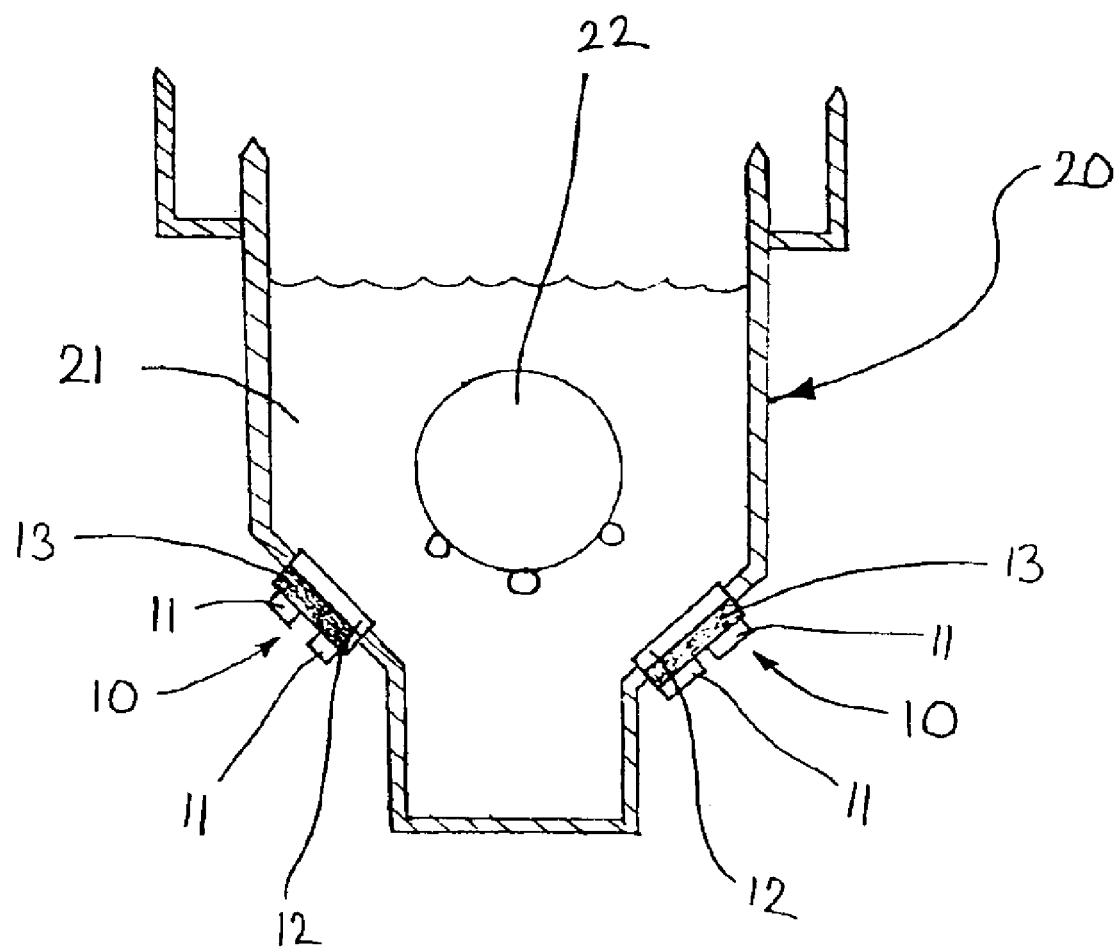
FIG. 3 is a schematic view of the acoustical stack of FIG. 2 coupled to a substrate process chamber.

Referring to FIGS. 2 and 3, acoustical stack 10 is schematically illustrated according to a first embodiment of the present invention. Acoustical stack 10 comprises two piezoelectric crystals 11, rigid plate 12, and transmission layer 13. Transmission layer 13 is positioned between piezoelectric crystals 11 and rigid plate 12. Piezoelectric crystals 11 are bonded to one side of transmission layer 13 while rigid plate 12 is bonded to the other side of transmission layer 13. Bonding is accomplished through the use of a bonding agent, such as epoxy. Once the acoustical stack 10 is assembled, acoustical stack 10 is coupled to a process chamber 20 so that the side of rigid plate 12 that is not bonded to the transmission layer 13 is in direct contact with that process fluid 21 that fills the process chamber 20. When crystals 11 are activated to produce acoustical energy, acoustical stack 10 will act as an acoustical energy pathway form the crystals 11 to the process fluid 21. When a substrate 22 is submerged in the process fluid 21 for processing, the acoustical energy will pass through the process fluid 21 and across the substrate's 22 surface.

Depending on the exact identity of the process fluid 21 being used to process substrate 22, the material of which rigid plate 12 is constructed, and the Za of piezoelectric crystals 11, the transmission layer 13 of acoustical stack 10 can be constructed of any material so long as its Za is less than the Za of the piezoelectric crystals 11 and greater than the Za of the rigid plate 12. For example, assuming that the piezoelectric crystals 11 have a $Za_{Crystal}=X$ and the rigid plate 12 has a $Za_{Rigid\ Plate}=Y$, the transmission layer 13 is designed so that $X>Za_{Transmition\ Layer}>Y$. It is assumed that the acoustical impedance of the rigid plate is greater than the acoustical impedance of the process fluid 21, which is typically in the range of 08–2.5 Mrayl. Thus, in essence, acoustical stack 10 is designed so that: $Za_{Crystal}>Za_{Transmition\ Layer}>Za_{Rigid\ Plate}>Za_{Process\ Fluid}$.

Rigid plate 12 is preferably a quartz plate. The crystals 11 are preferably piezoelectric crystals. The transmission material 13 is preferably aluminum, titanium, or beryllium. Alternatively, a very thick layer of epoxy can be used itself as the transmission material 13. Depending on the process to be performed on the substrate, the process fluid can be DI water, ozonated DI water, or an ozone mist.

There is no limit to the number of transmission layers that can be used and still be within the scope of the invention. The only requirement is that the Za of each transmission layer decrease the Za difference between its surrounding layers. Moreover, the transmission layers can be used just to change the overall performance or characteristics over a range of frequencies or at critical frequencies. Additionally, it is possible for the term "rigid plate" to simply be replaced by the term "transmission layer," so long as it meets the above requirements. In such a scenario, the assembly becomes a stack of transmission layers.

Figure 4:
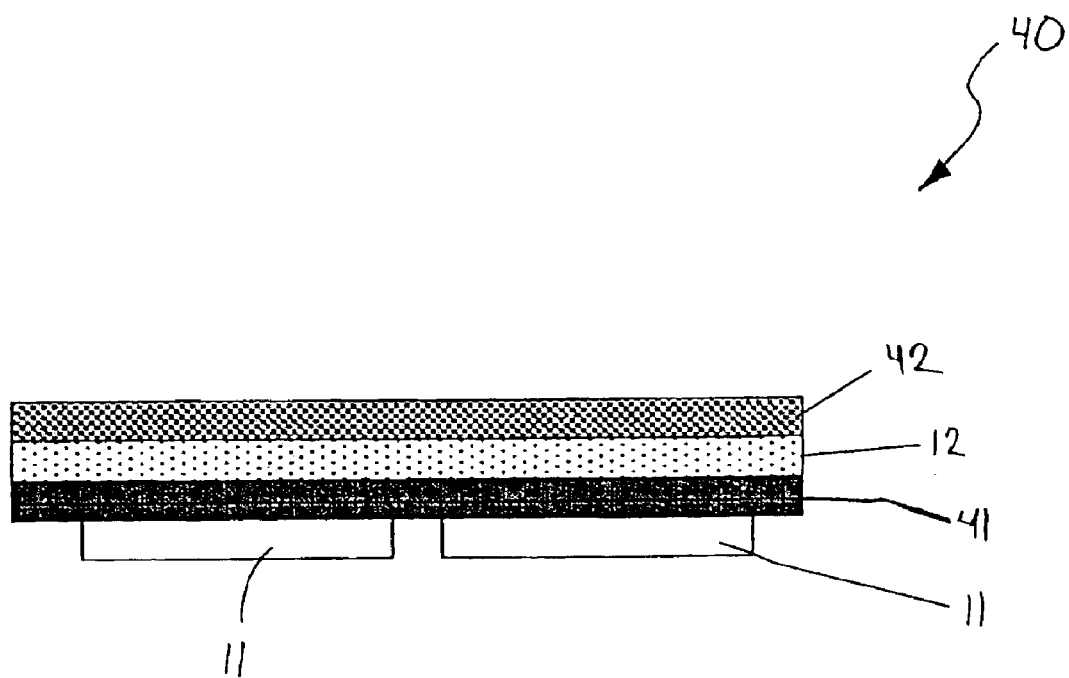
FIG. 4 is a schematic of an acoustical stack according to a second embodiment of the present invention.

Turning now to FIG. 4, acoustical stack 40 is illustrated according to a second embodiment of the present invention. Acoustical stack 40 comprises first transmission layer ("TL 1") 41 positioned between the crystals 11 and the rigid plate 12. Acoustical stack 40 also has a second transmission layer ("TL 2") 42 positioned on the other side of the rigid plate 12. When acoustical stack 40 is coupled to a process chamber, similar to the coupling illustrated in FIG. 3 for acoustical stack 10, the second transmission layer 42 of acoustical stack 40 will be in contact with the process fluid. In this embodiment, the first and second transmission layers 41, 42 are used to more gradually transition the Za between the crystals 11 and the process fluid. The system is designed so that $Za_{Crystal}>Za_{TL1}>Za_{Rigid\ Plate}>Za_{TL2}>Za_{Process\ Fluid}$. In this embodiment, preferably, crystals 11 are piezoelectric crystals, first transmission layer 41 is made of aluminum, titanium, or beryllium, rigid plate 12 is a quartz plate, and the second transmission layer 42 can be made of polychlorotrifluoroethylene ("PCTFE"), ethylenechloretrifluoroethylene ("ECTFE"), tetraflourethylene-perfluorpropylene ("FEP"), perfluoroalkoxy ("PFA"), polyvinylidene fluoride ("PVDF"), polychlorotrifluoroethylene ("PCTFE"), teflon, or other fluorocarbon based polymer or thermoplastic polymer.

Figure 5:
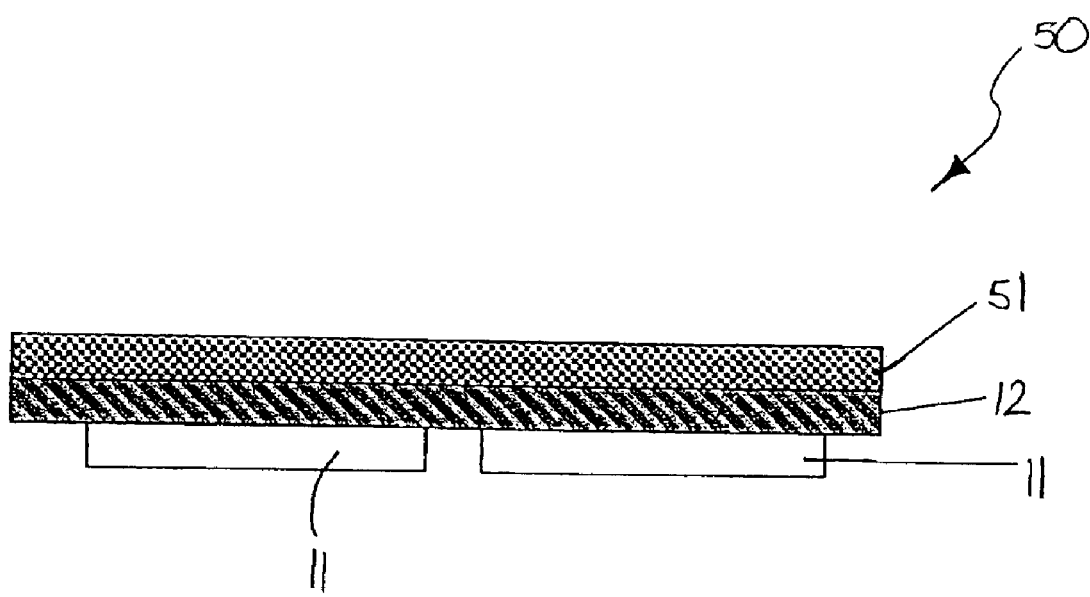
FIG. 5 is a schematic of an acoustical stack according to a third embodiment of the present invention.

Referring now to FIG. 5, acoustical stack 50 is illustrated according to a third embodiment of the present invention. Acoustical stack 50 comprises a single transmission layer 51 coupled to one side of rigid plate 12. When coupled to a process chamber, transmission layer 51 will be between the rigid plate 12 and the process fluid. In this embodiment, a single transmission layer 51 is used to more gradually transition the Za between the rigid plate 12 and the process fluid. The acoustical stack 50 is designed so that $Za_{Crystal}<Za_{Rigid\ Plate}>Za_{Transmission\ Layer}>Za_{Process\ Fluid}$. In this embodiment, crystals 11 can be piezoelectric crystals, rigid plate 12 can be made of stainless steel, and transmission layer 51 can be made of PCTFE, ECTFE, FEP, PFA, teflon, or other fluorocarbon-based polymers or thermoplastic polymers. This embodiment does not follow the Za step down rule one hundred percent, but the transmission layer still provides improved transmission from the stainless steel plate to the process fluid.

In all embodiments of the acoustical stack, a bonding agent is used to attach consecutive layers, typically epoxy. Additionally, a very thick layer of epoxy can be used itself as a transmission material. The term "fluid" as used herein, encompasses both liquids and gases.

Various alternatives, alterations, and modifications should be readily apparent to those skilled in the art without departing from the spirit and scope of the invention. The above embodiments of the acoustical stack can be used for a variety of substrate processing steps, including but not limited to cleaning and stripping.

What is claimed is:

1. A system for processing at least one substrate comprising:
   a process chamber for receiving a process fluid;
   an acoustical energy source;
   an acoustical stack for transmitting acoustical energy from the acoustical energy source to process fluid in the process chamber, the acoustical stack comprising three or more consecutive transmission layers including a first transmission layer in contact with the acoustical energy source and a last transmission layer in contact with process fluid in the process chamber;
   wherein from the first transmission layer to the last transmission layer, each transmission layer in the acoustical stack has an acoustical impedance value that is less than an acoustical impedance value of a consecutively preceding transmission layer.

2. The system of claim 1 wherein the first transmission layer is made of aluminum, titanium, or beryllium.

3. The system of claim 1 wherein the number of consecutive transmission layers in the acoustical stack is three, including a second transmission layer consecutively located between the first transmission layer and the last transmission layer.

4. The system of claim 3 wherein the second transmission layer is a rigid plate for mounting the acoustical stack to the process chamber.

5. The system of claim 3 wherein the first transmission layer is made of aluminum, titanium, or beryllium, the second transmission layer is made of quartz, the last transmission layer is made of PCTFE, ECTFE, PVDF, FEP, or PFA and the acoustical energy source comprise piezoelectric crystals.

6. The system of claim 1 the process fluid having an acoustical impedance value less than the acoustical impedance value of the last transmission layer.

7. The system of claim 6 wherein the acoustical impedance value of the process fluid is in the range of approximately 0.8 to 2.5 Mrayl.

8. The system of claim 1 wherein the acoustical energy source has an acoustical impedance value that is less than the acoustical impedance value of the first transmission layer.

9. The system of claim 1 wherein the acoustical energy source has an acoustical impedance value that is greater than the acoustical impedance value of the first transmission layer.

10. The system of claim 1 wherein the first transmission layer is made of aluminum, titanium, or beryllium.

11. The system of claim 3 wherein the second transmission layer is made of quartz.

12. The system of claim 1 wherein the last transmission layer is made of PCTFE, ECTFE, PVDF, FEP, or PFA.

13. A method of processing a substrate comprising:
    providing a system comprising a process chamber, an acoustical energy source, an acoustical stack forming an acoustical energy pathway from the acoustical energy source to a process fluid in the process chamber, the acoustical stack comprising three or more consecutive transmission layers including a first transmission layer in contact with the acoustical energy source and a last transmission layer in contact with the process fluid in the process chamber, wherein from the first transmission layer to the last transmission layer, each transmission layer in the acoustical stack has an acoustical impedance value that is less than an acoustical impedance value of a consecutively preceding transmission layer;
    contacting a substrate with the process fluid;
    creating acoustical energy with the acoustical energy source; and
    transmitting the acoustical energy to the process fluid via the acoustical stack.

14. The method of claim 13 wherein the first transmission layer is made of aluminum, titanium, or beryllium.

15. The method of claim 13 wherein the number of consecutive transmission layers in the acoustical stack is three, including a second transmission layer consecutively located between the first transmission layer and the last transmission layer.

16. The method of claim 15 wherein the second transmission layer is a rigid plate for mounting the acoustical stack to the process chamber.

17. The method of claim 15 wherein the first transmission layer is made of aluminum, titanium, or beryllium, the second transmission layer is made of quartz, the last transmission layer is made of PCTFE, ECTFE, PVDF, or PFA and the acoustical energy source comprise piezoelectric crystals.

18. The method of claim 17 wherein the process fluid has an acoustical impedance value less than the acoustical impedance value of the last transmission layer.

19. The method of claim 18 wherein the acoustical impedance value of the process fluid is in the range of approximately 0.8 to 2.5 Mrayl.

20. The method of claim 13 wherein the process fluid comprises DI-water and the method further comprises removing contaminants from the substrate.

21. The method of claim 13 wherein the process fluid comprises ozone and the method further comprises stripping photoresist from the substrate.

22. The method of claim 13 wherein the acoustical energy source has an acoustical impedance value that is less than the acoustical impedance value of the first transmission layer.

23. The method of claim 13 wherein the acoustical energy source has an acoustical impedance value that is greater than the acoustical impedance value of the first transmission layer.

24. The method of claim 13 wherein the first transmission layer is made of aluminum, titanium, or beryllium.

25. The method of claim 15 wherein the second transmission layer is made of quartz.

26. The method of claim 13 wherein the last transmission layer is made of PCTFE, ECTFE, PVDF, FEP, or PFA.

27. The method of claim 13 wherein the contacting step comprises submerging the substrate in the process fluid.

* * * * *